United States Patent
Becker et al.

(10) Patent No.: US 6,720,273 B1
(45) Date of Patent: Apr. 13, 2004

(54) DEVICE AND METHOD FOR THE HIGH-FREQUENCY ETCHING OF A SUBSTRATE USING A PLASMA ETCHING INSTALLATION AND DEVICE AND METHOD FOR IGNITING A PLASMA AND FOR PULSING THE PLASMA OUT PUT OR ADJUSTING THE SAME UPWARDS

(75) Inventors: Volker Becker, Marxzell (DE); Franz Laermer, Stuttgart (DE); Andrea Schilp, Schwäbisch Gmünd (DE); Thomas Beck, Kirchberg/Murr (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/763,138
(22) PCT Filed: Jun. 16, 2000
(86) PCT No.: PCT/DE00/01906
§ 371 (c)(1), (2), (4) Date: Apr. 20, 2001
(87) PCT Pub. No.: WO00/79579
PCT Pub. Date: Dec. 28, 2000

(30) Foreign Application Priority Data

Jun. 18, 1999 (DE) ......................... 199 27 806

(51) Int. Cl.⁷ .......................... H01L 21/3065
(52) U.S. Cl. ............ 438/723; 438/729; 438/743; 156/643; 156/345
(58) Field of Search ................. 438/723, 729, 438/743; 156/643, 345, 345.49, 345.48; 216/68, 67, 74, 80; 118/723 MW, 723 ME, 345

(56) References Cited

U.S. PATENT DOCUMENTS

| | | | |
|---|---|---|---|
| 4,987,346 A | * 1/1991 | Katzschner et al. | .... 315/111.41 |
| 5,078,039 A | * 1/1992 | Tulk et al. | ........ 84/464 R |
| 5,173,640 A | * 12/1992 | Geisler et al. | ........ 315/111.21 |
| 5,418,707 A | * 5/1995 | Shimer et al. | ........ 363/65 |
| 5,556,501 A | * 9/1996 | Collins et al. | ........ 156/345.38 |
| 5,844,195 A | * 12/1998 | Fairbairn et al. | ...... 219/121.43 |
| 5,954,882 A | * 9/1999 | Wild et al. | ........ 118/723 MW |
| 6,036,877 A | * 3/2000 | Collins et al. | ........ 216/68 |
| 6,054,063 A | 4/2000 | Ohtake et al. | |
| 6,488,807 B1 | * 12/2002 | Collins et al. | ........ 156/345.49 |
| 6,518,195 B1 | * 2/2003 | Collins et al. | ........ 438/723 |

FOREIGN PATENT DOCUMENTS

| | | |
|---|---|---|
| DE | 42 41 045 | 3/1996 |
| DE | 197 34 278 | 2/1999 |
| DE | 199 00 179 | 2/2000 |
| EP | 0 363 982 | 4/1990 |
| EP | 0 822 582 | 2/1998 |
| JP | 07288191 | 10/1995 |
| JP | 11 016892 | 1/1999 |
| WO | WO 00 62328 | 10/2000 |

* cited by examiner

Primary Examiner—Carl Whitehead, Jr.
Assistant Examiner—Laura M Schillinger
(74) Attorney, Agent, or Firm—Kenyon & Kenyon

(57) ABSTRACT

A device and a method capable of being carried out therewith for, preferably, anisotropically etching a substrate (10), in particular, a patterned silicon body, with the assistance of a plasma (14), is proposed. In the process, the plasma (14) is produced by a plasma source (13) to which a high-frequency generator (17) is connected for applying a high-frequency power. Moreover, this high-frequency generator is in communication with a first means which periodically changes the high-frequency power applied to the plasma source (13). Besides, provision is preferably made for a second means which adapts the output impedance of the high-frequency generator (17) to the prevailing impedance of the plasma source (13) which changes as a function of the high-frequency power. The proposed anisotropic etching method is carried out in separate and alternating etching and polymerization steps, a higher high-frequency power of up to 5000 watts being, at least temporarily, applied to the plasma source (13) during the etching steps than during the deposition steps. The proposed device is also suitable for igniting a plasma (14) and for adjusting upward or pulsing a plasma power from a starting value to up to 5000 watts.

16 Claims, 1 Drawing Sheet

DEVICE AND METHOD FOR THE HIGH-FREQUENCY ETCHING OF A SUBSTRATE USING A PLASMA ETCHING INSTALLATION AND DEVICE AND METHOD FOR IGNITING A PLASMA AND FOR PULSING THE PLASMA OUT PUT OR ADJUSTING THE SAME UPWARDS

FIELD OF THE INVENTION

The present invention relates to a device and a method for high-rate etching a substrate, in particular, in an anisotropic manner, using a plasma etching system, it being possible to achieve periodically varying plasma powers of up to 5000 watts as well as to a device and a method for igniting a plasma and to adjusting upward or pulsing the plasma power according to the species defined in the independent claims.

DESCRIPTION OF RELATED ART

German Patent 42 41 045 C1 describes a method for anisotropically etching silicon using high etching rates and high mask selectivity, a high-density plasma source having preferably inductive high-frequency excitation being used for liberating fluor radicals from a fluor-delivering etching gas and $(CF_2)_x$-radicals from a passivating gas delivering Teflon-forming monomers. In the process, etching gas and passivating gas are used alternatingly, a side wall polymer film being built up on the side walls of already etched patterns during the passivation steps or polymerization steps, the side wall polymer film, during the per se isotropic etching steps, each time being partially removed again with the assistance of ions and, at the same time, the silicon pattern ground being etched by fluor radicals. This process requires a high-density plasma source which also generates a relatively high density of ions ($10^{10}$–$10^{11}$ cm$^{-3}$) of low energy.

An increase in the etching rate, which is required for many applications, is generally to be expected when the high-frequency power coupled into the plasma is increased.

In methods as described in German Patent 42 41 045 C1, however, this is surprisingly not the case. Instead, it is observed that the etching rate in silicon increases only slightly in response to increasing the power of the plasma source while, at the same time, unwanted profile deviations, in particular, in the upper third of the produced trenches, greatly increase, resulting in profile indentations or undercuts of the mask edge.

These effects, on one hand, originate from unwanted capacitive interferences from regions of the inductive plasma source, which carry very high high-frequency voltages. When working with higher powers and voltages, these unwanted interference effects are naturally higher as well.

In so far as the plasma source itself is affected, the mentioned effects can be rectified at least to a great extent by advanced feed concepts of the plasma source and, for example, by using a special aperture as is described in German Patent 197 34 278 C1. However, those profile deteriorations which are due to the process and therefore have to be tackled from the process side remain.

While in simple plasma patterning processes, an increase in the plasma power, because of the resulting increased production of ions and etching species, gives rise to the desired increase in the etching rate, in the case of the method according to German Patent 42 41 045 C1, the deposition steps must also be taken into account in addition to the etching steps. In this context, an increase in the plasma power during the etching steps not only results in the desired increased production of etching species and ions but also changes the deposition steps in a characteristic manner.

A very important aspect of German Patent 42 41 045 C1 is the side wall film transport mechanism which, during the per se isotropic etching steps, assures that the side wall protective film is also moved into the depth of the trench during further etching and that it can provide local edge protection already there. However, during the deposition or polymerization steps themselves, such a transport mechanism is only desired within certain limits. Thus, the intention is, in particular, to prevent that excessive side wall polymer is driven down into the trenches already during the deposition cycles and that it is then lacking above, i.e., the side wall film gets too thin there.

If the plasma power is increased during the etching and deposition steps, for example, in the case of a process according to German Patent 42 41 045 C1, an increased polymer transport from the side wall into the depth of the trenches takes place, per se unintentionally, also during the deposition steps in competition to the coating of the side walls since, above a certain plasma power, the deposition rate can no longer be substantially increased but, instead, ions are increasingly produced which impinge on the substrate to be etched.

Due to the plasma potential which lies somewhat above the substrate potential even without an additionally applied substrate electrode voltage, this increasing ion flux toward the substrate results in that an increasing part of the deposited film material is pushed into the depth of the trenches and to the etching ground already during the deposition steps. In particular, the plasma has a plasma potential of several Volts up to several 10 Volts with respect to grounded surfaces and, consequently, also with respect to a substrate on the substrate electrode, which is tantamount to a corresponding ion acceleration toward the wafer. Therefore, an increased ion density also signifies an increased ion action upon the substrate surface and, in particular, upon the trench side walls although, explicitly, no ion acceleration voltage is applied to the substrates.

As a result of the explained polymer removal and carrying over into the depth of the trenches already during the deposition steps in the case of very high plasma powers, the polymer material needed for the side wall protection in the subsequent etching steps is finally lacking in the upper parts of the etched trenches when working with high plasma powers, which manifests itself in the mentioned profile deviations more or less in the upper third of the trench profile. At the same time, the polymer material transported to the etching ground in excess also disturbs the etch removal during the subsequent etching steps and, on the whole, leads to the observed saturation of the etching rate in spite of the further power increase in the source. A further effect in this connection is the "hardening" of the deposited polymer material when working with very high power densities, i.e., an increased carbon content in polymers compacted in this manner, which makes the subsequent polymer removal more difficult and, consequently, reduces the etching rates.

SUMMARY OF THE INVENTION

Therefore, it is an object of the present invention to overcome a saturation of the etching rate in spite of a higher high-frequency power provided by the plasma source, thus drastically increasing the etching rate. A further object of the present invention is to enable the ignition and the coupling in of very high high-frequency powers into a, in particular, inductive plasma source in a stable manner.

The devices according to the present invention and the methods according to the present invention having the characterizing features of the independent claims have the advantage over the background art that they allow the high-frequency power applied to a plasma source to be periodically changed so that, for example, alternating deposition or polymerization and etching steps can be carried out very advantageously using high-frequency powers of different magnitude. In this context, a higher high-frequency power is in each instance very advantageously applied to the plasma source during the etching steps than during the deposition steps.

Moreover, using the device for etching according to the present invention and the method for anisotropically etching a substrate according to the present invention, considerably higher etching rates can be achieved than with known etching methods and etching devices. In this context, the difficulty existing in known methods heretofore that, in spite of a continuous increase in the plasma power, a saturation of the etching rate occurs in anisotropic etching methods where deposition steps and etching steps are used alternatingly.

Furthermore, it is very advantageous that the device according to the present invention and the method for igniting and adjusting upward a plasma carried out therewith, for the first time, allow very high high-frequency powers to be coupled into a, in particular, inductive plasma source in a stable manner.

Advantageous embodiments of the present invention are derived from the measures specified in the subclaims.

Thus, the method according to the present invention allows the method according to German Patent 42 41 045 C1 to be considerably improved in a very advantageous manner by applying a low plasma power during the deposition steps and by applying a very high plasma power during the etching steps, extremely high etching rates being attained, for example, in silicon while retaining the advantages known from German Patent 42 41 045 C1. In the etching method according to the present invention, in particular, the deposition steps very advantageously remain nearly unchanged. Moreover, the etching steps are advantageously carried out using very high plasma powers of up to 5000 watts at preferably increased $SF_{6/O2}$ flow and preferably increased process pressure.

Besides, the uniformity of the etching process is significantly improved by switching back the high-frequency power, according to the present invention, during the polymerization steps so that the substrate center and the substrate edge have nearly identical etching rates. This is true, in particular, if the method for high-rate etching according to the present invention is combined with an aperture device in the plasma etching system as is known from German Patent 197 34 278. A very particularly advantageous variant of the method according to the present invention with regard to the uniformity of the etching over a wafer results if a plasma etching system as is known, for example, from German Patent 197 34 278 is further operated using a symmetrically fed plasma source as is proposed in German Application 199 00 179.

Moreover, the device for etching a substrate according to the present invention allows very high high-frequency powers of up to 5000 watts to be coupled into, in particular, inductive plasma sources in a stable manner. To this end, provision is advantageously made for a second means, in particular, for an automated impedance transformer which is controlled in a manner corresponding to the variation in the high-frequency power of the plasma source. Besides, the speed-adapted variation in power of the plasma source or of the high-frequency generator feeding the plasma source, respectively, is at the same time achieved in an advantageous manner via a ramp generator.

In this context, controlling the plasma power using a high-frequency generator and a ramp generator being in communication therewith as well as an impedance transformer for adapting the impedance, in particular, in a continuous and automated manner, is very advantageously suitable both for igniting and for adjusting upward a plasma up to highest power values and for alternating the power parameters at the plasma source between etching and deposition steps according to the present invention.

The increased formation of etching species through a higher plasma power can further be promoted in an advantageous manner by increasing the flow of the fluor-delivering etching gas, for example, $SF_6$ simultaneously with the increase in power. In this case, to prevent sulfur depositions in the exhaust area of the etching system, the oxygen content is to be advantageously adjusted correspondingly. A further expedient way of increasing the production of fluor radicals concurrently with the power increase during the etching steps is increasing the process pressure. In this manner, fluor radicals are increasingly produced in the etching plasma in place of additional ions, thus increasing the ratio of the number of fluor radicals to the ion density. The exceeding of a certain ion density in the case of very high plasma powers is a disadvantage.

Besides, the power is advantageously not increased to, for example, more than 1500 watts during the deposition or polymerization steps. Since the deposition rate on the substrate suffices already when working with a relatively small power of 400 watts to 800 watts, an increase in power of the plasma source during the deposition steps combined with otherwise unchanged plasma etching parameters would, in any case, yield only few additional deposition species or would excessively compact the deposited polymer and lead to a carbon concentration in the polymer. Moreover, by maintaining the original small power of up to 1500 watts during the deposition process, it is, at the same time, advantageously avoided that the ion density and, consequently, the ion action upon the substrate are increased during the deposition steps. Because of this, the explained detrimental consequences of an increased ion density during the deposition steps do no occur.

BRIEF DESCRIPTION OF THE DRAWINGS

The present invention is explained in greater detail on the basis of the drawing and in the following description.

DETAILED DESCRIPTION OF THE INVENTION

Figure 1:
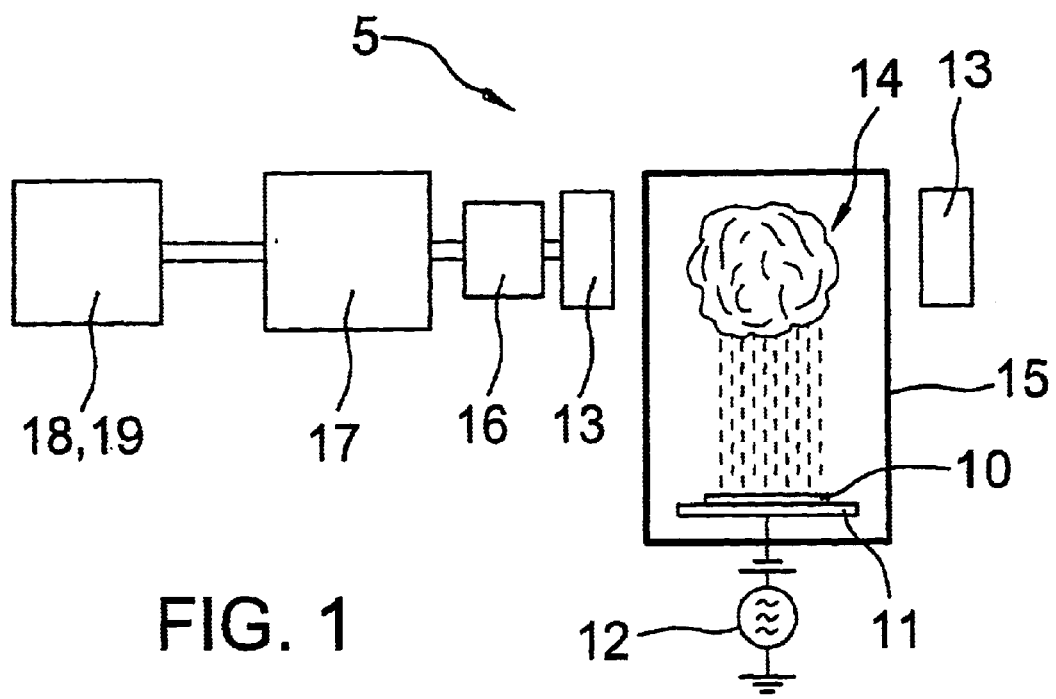
FIG. 1 shows a plasma etching system having add-on parts.

FIG. 1 shows a plasma etching system 5 having a substrate 10, in particular, a patterned silicon wafer, which is to be provided with trenches in an anisotropic plasma etching method, and having a substrate electrode 11, a high-frequency a.c. voltage being applied, via a substrate voltage generator 12, to substrate electrode 11 and, via the substrate electrode, also to substrate 10. Moreover, provision is made for a plasma source 13 in the form of an inductive plasma source (ICP coil), known per se, which, together with an introduced reactive gas mixture, produces a plasma 14 in a reactor 15. To this end, a high-frequency electromagnetic alternating field is generated via a high-frequency generator 17, the reactive gas mixture being exposed to the electromagnetic alternating field. An arrangement of that kind is known, for example, from German Patent 197 34 278 C1. In FIG. 1, moreover, provision is made for high-frequency generator 17 to be in communication with a component 18 incorporating a ramp generator 19, and for high-frequency generator 17 and plasma source 13 to be in communication via an impedance transformer 16 ("matchbox") known from the background art. The function and design of such a "matchbox" are known per se. A particularly advantageous embodiment of the "matchbox" in connection with an inductive plasma source having balanced coil power supply is described in unpublished German Application 199 00 179.5.

Using plasma etching system 5, for example, an anisoptropic etching process including alternating etching and deposition steps is then carried out as is described, for example, in German Patent 197 34 278 C1 or, in particular, in German Patent 42 41 045 C1, the high-frequency power applied to plasma source 13 being changed periodically.

To this end, initially, high-frequency powers of 400 watts up a maximum of 1500 watts, preferably from 600 watts to 800 watts are applied to inductive plasma source 13 during the deposition steps. In the process, the process pressure lies between 5 mTorr to 100 mTorr, for example, at 20 mTorr.

The gas flow for the octafluorocyclobutane ($C_4F_8$) or hexafluoropropene ($C_3F_6$) used as passivating gas in the discussed example is 30 sccm to 200 sccm, preferably 100 sccm. The duration of a deposition step is 1 second to 1 minute, for example, 5 seconds.

During the etching steps following the deposition steps, high-frequency powers of 600 watts to 5000 watts, preferably of 3000 watts, are applied to inductive plasma source 13. In the process, the process pressure lies between 5 mTorr and 100 mTorr, for example, at 30 mTorr or 50 mTorr, and is preferably increased in comparison with the process pressure during the deposition steps. In the case of the etching gas $SF_6$ used in the discussed example, the used gas flows are 100 sccm to 500 sccm, preferably, 200 sccm to 300 sccm, oxygen being added to etching gas $SF_6$ in a proportion of 10 to 20 percent, preferably 15% in a manner known per se to prevent sulfur depositions in the exhaust area of etching system 5.

During the etching steps, moreover, a high-frequency power of 1 watt to 50 watts is applied to substrate electrode 11 to accelerate ions generated in plasma 14 toward substrate 10. In the discussed example, this high-frequency power is 8 watts in the case of a customary 6"-silicon wafer as substrate 10. According to the specific high-frequency power, moreover, an ion acceleration voltage of 1 V to 50 V, for example, of 15 V, is applied to substrate electrode 11. The duration of the etching step is approximately 3 seconds up to 2 minutes. In the discussed example, the duration is approximately 10 seconds.

The application of very high powers of up to 5000 watts to inductive plasma source 13 is technically very problematic since the plasma impedance changes in the measure in which the power is increased at plasma source 13. This is because an increasing electron and ion density is produced in plasma 14 as the plasma power, i.e., the excitation of plasma 14, increases. With the higher electron and ion density, however, plasma 14 increasingly has a lower impedance as seen from 40 plasma source 13, i.e., the ideal state given in the case of high-density plasmas, the "short-circuit case", is more and more approached. This means at the same time that the adaptation conditions of inductive plasma source 13 to high-frequency generator 17, which usually has a fixed output impedance of mostly 50 Ω, change, namely dynamically with increasing power. Therefore, the output impedance of high-frequency generator 17 needs to be adapted to the impedance of inductive plasma source 13 which essentially depends on the produced charge carrier density in plasma 14.

In the discussed example, impedance transformer 16 ("matchbox") is provided for that purpose. This impedance transformer 16, usually by automatically and continuously or stepwise varying two variable capacitors which constitute a capacitive transformer (voltage divider), guarantees that plasma 14 or plasma source 13, respectively, are always optimally adapted, in terms of their impedance, to high-frequency generator 17 and its high-frequency power. If this adaptation is not correct, reflected powers of up to 100 percent of the high-frequency power input occur which return into high-frequency generator 17, and there usually adjust back the forward power to prevent the generator output stage from being destructed. In the case of the plasma powers of up to 5000 watts used in the discussed example, this impedance adaptation is necessarily carried out dynamically.

Thus, for igniting plasma 14, the impedance transformer is initially brought into a so-called "preset" position which, up to a certain low plasma power, corresponds to the optimum "burning position" of impedance transformer 16, i.e., the position of impedance transformer 16 in the state "plasma on, low power". In this case, the automatic control of impedance transformer 16 must take over only a fine control to compensate for small tolerances of the plasma impedance. However, if the plasma power subsequently increases to values of, for example, more than 1000 watts, as used in the discussed example during the etching steps or while the plasma power is adjusted upward upon ignition, the plasma impedance changes significantly. Thus, for example, with 3000 watts high-frequency power coupled in at inductive plasma source 13, the adjustment of impedance transformer 16 is significantly different from the ignition position or the position with low plasma power.

The equivalent applies when the plasma power is switched from a lower to a markedly higher value during the transition from a deposition step to an etching step such as in the present example. The sudden power variation requires a corresponding correction at impedance transformer 16. If this correction is not carried out fast enough, the forward power on the generator side is abruptly reduced by corresponding protective circuits and, consequently, plasma 14 is temporarily extinguished or constantly blinks.

In a preferred embodiment of the present invention, the explained difficulties during the ignition and adjusting upward of a plasma 14 in the case of plasma powers between 800 watts and 5000 watts as well as the periodic changeover of the plasma power, for example, between deposition steps and etching steps are solved in the discussed example in that the power of high-frequency generator 17 is increased "adiabatically", i.e., continuously or stepwise using a rate of rise which can be dynamically corrected by impedance transformer 16. In the discussed example, this means that the plasma power, for example, during the transition from a deposition step to an etching step, is increased in a slowed down manner while, at the same time, impedance transformer 16 continuously adapts to or corrects the changing impedance conditions on the basis of the changing plasma conditions.

In the concrete case of the plasma ignition, this manifests itself as follows: impedance transformer 16 is in the preselected ignition position and high-frequency generator 17 begins to adjust upward its power output continuously or stepwise in small steps from a preselected starting value to a target value. Plasma 14 will then ignite at a certain power, for example, 400 watts so that a defined impedance is present at plasma source 13. While high-frequency generator 17 then further increases its power output, more and more charge carriers are produced in plasma 14 and, consequently, the plasma or source impedance is changed. Impedance transformer 16 allows for these changes by ensuring the correct impedance transformation continuously and automatically, for example, in a manner known per se by adjusting variable capacitors. Thus, in the measure in which the generator power output increases, impedance transformer 16 automatically and as concurrently as possible adapts its adjustment at least temporarily to the resulting plasma conditions. In this manner, it is therefore also possible for plasma powers of several kilowatts, in particular, up to 5000 watts to be coupled into plasma 14 in a stable manner.

In the discussed example, typical values for the starting value lie at approximately 0 to 400 watts whereas the target value is usually 800 watts to 5000 watts. The time required for increasing the power between starting and target values typically lies at 0.2 sec to 5 sec in particular, 0.5 sec to 2 sec.

In the discussed example, it is essential that, at least during power increases, no sudden changes in the power of high-frequency generator 17 occur which cannot be corrected by impedance transformer 16 but, if possible, all power changes be adapted to the correction rate of impedance transformer 16.

This also applies, in particular, to the alternation of the plasma power according to the present invention from a low value during the deposition steps to a very high value, preferably in the kilowatt range, during the etching steps. In this context, the deposition step with its relatively little power is initially uncritical. If now the change to the etching step takes place, the generator slowly adjusts upward its power output until, for example, after 2 seconds, the full generator power desired in the etching step is applied to plasma source 13. In the case of such a rate of rise, customary impedance transformers can easily correct the adjustment correspondingly.

During the change into the deposition step, the plasma power can be reduced to the lower power value, which is desired in the deposition steps, either suddenly or preferably also "adiabatically", i.e. in a slowed down manner and adapted to the correction rate of impedance transformer 16. Since the power during the deposition steps is uncritically low, however, both options are available here.

In the discussed example, the "adiabatic" control of the power of high-frequency generator 17 can be carried out either stepwise in small steps or continuously. To this end, for example, in component 18, a digital ramp generator is programmed in a software-controlled manner which is known per se or an analog ramp generator 19, also known per se, is incorporated in component 18, thus being interconnected between the setpoint value output of a power control which, for example, is incorporated in component 18, and the setpoint value input of high-frequency generator 17.

Software control or the digital ramp generator are recommendable especially if the power of the high-frequency generator is requested using a digital command, for example, via a serial interface (RS232) as is the case with many known etching systems. In this case, the power of high-frequency generator 17 must be adjusted upward in small steps, starting from a starting value up to the desired target value, by a series of digital commands.

The analog variant via analog ramp generator 19 between the output of the system control and a generator setpoint value input is recommendable especially if high-frequency generator 17 is controlled using an analog signal, for example, a level value between 0 V and 10 V.

Figure 2:
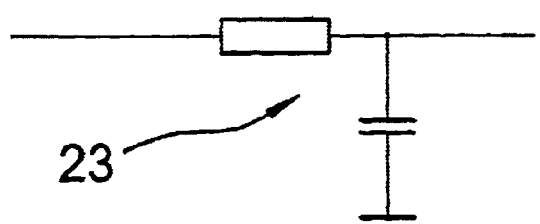
FIG. 2 shows a first RC circuit used in an analog ramp generator.

The simplest version of an analog ramp generator 19 is an RC circuit 23 shown in FIG. 2, having a time constant which is adapted according to the desired rate of rise of the power of high-frequency generator 17. This first RC circuit has a delaying effect both in the upward and downward directions.

Figure 3:
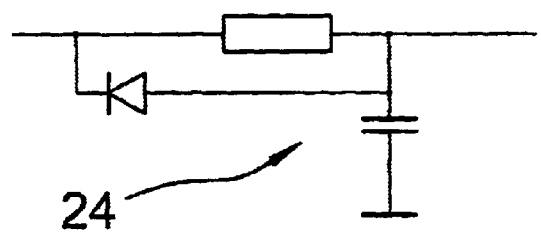
FIG. 3 shows a second RC circuit having a diode.

If the intention is for ramp generator 19 to be active only in the upward direction, i.e., only during power increase, but a desired decrease in the power of high-frequency generator 17 is intended to occur immediately, i.e. instantly, preferably, a second RC circuit 24 provided with a diode as is shown in FIG. 3 is used.

Figure 4:
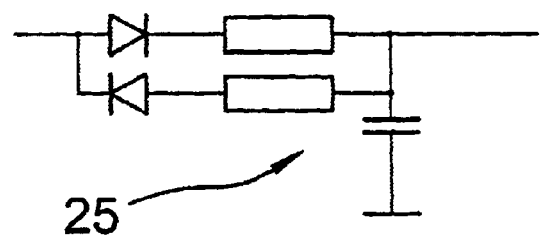
FIG. 4 shows a third RC circuit having two diodes.

If two freely selectable delay values are desirable for adjusting upward and adjusting downward the power of high-frequency generator 17, preferably, a third RC circuit 25 provided with two different resistors and diodes allocated respectively as is shown in FIG. 4 is used.

However, the exemplary circuits for ramp generators illustrated in FIGS. 2 through 4 are background art and are only intended to explain the design of the variants according to the present invention and to indicate to one skilled in the art how the desired ramp function can be derived therefrom. In FIGS. 2 through 4, in particular, the conducting-state voltage of approximately 0.6 Volts of the diodes is not taken into account.

In the discussed example, altogether, the typical duration of the increase in the high-frequency power during the change from a deposition step to an etching step lies at 0.2 to 5 sec, in particular, 0.5 sec to 3 sec. Compared to that, the duration of the decrease in the high-frequency power during the change from an etching step to a deposition or polymerization step is markedly shorter and lies between 0 sec to 2 sec, in particular 0 sec to 0.5 sec.

| List of Reference Numerals | |
| --- | --- |
| 5 | plasma etching system |
| 10 | substrate |
| 11 | substrate electrode |
| 12 | substrate voltage generator |
| 13 | plasma source |
| 14 | plasma |
| 15 | reactor |
| 16 | impedance transformer |
| 17 | high-frequency generator |
| 18 | component |
| 19 | ramp generator |
| 23 | first RC circuit |
| 24 | second RC circuit |
| 25 | third RC circuit |

What is claimed is:

1. A device for etching a patterned silicon body substrate with a plasma, comprising:

a high-frequency generator;

a plasma source for generating a high-frequency electromagnetic alternating field, a high frequency power to be applied to the plasma source with assistance of the high-frequency generator;

a reactor for generating the plasma from reactive particles through an action of the high-frequency electromagnetic alternating field upon one of a reactive gas and a reactive gas mixture; and a first arrangement for producing a periodical change in the high-frequency power applied to the plasma source;

wherein the first arrangement includes one of:

a component for controlling a power of the high-frequency generator, a digital ramp generator being programed via a software in the component, and a component for controlling the power of the high-frequency generator including an analog ramp generator.

2. The device according to claim 1, wherein the analog ramp generator has an RC circuit which is provided with at least one diode.

3. The device according to claim 1, further comprising a second arrangement which, during the periodical change in the high-frequency power applied to the plasma source, at least temporarily adapts an output impedance of the high-frequency generator to a prevailing impedance of the plasma source which changes as a function of the high-frequency power.

4. The device according to claim 3, wherein:

the adaptation of the output impedance is carried out one of continuously and stepwise and is automated; and the applied high-frequency power lies between 400 W and 5000 W.

5. The device according to claim 3, wherein the second arrangement is an impedance transformer.

6. A method for anisotropically etching a substrate using a device for etching the substrate with a plasma, comprising the steps of:

causing a plasma source to generate a high-frequency electromagnetic alternating field, a high-frequency generator being adapted to apply a high-frequency power to the plasma source;

causing a reactor to generate the plasma from reactive particles through an action of the high-frequency electromagnetic alternating field upon one of a reactive gas and a reactive gas mixture;

causing a first arrangement to produce a periodical change in the high-frequency power applied to the plasma source by one of:

operating a component for controlling a power of the high-frequency generator via a software-programmed digital ramp generator, and operating a component including an analog ramp generator and for controlling the power of the high-frequency generator, carrying out the anisotropic etching process in separate etching and polymerization steps alternatingly following each other; and applying a polymer to lateral patterns defined by an etching mask during the polymerization steps, the polymer being removed again in each case during the subsequent etching steps;

wherein, during the etching steps, at least temporarily, and in each case higher high-frequency power is applied to the plasma source than during the deposition steps.

7. The method according to claim 6, wherein during the etching steps, at least temporarily, a high-frequency power of 800 watts to 5000 watts is applied to the plasma source, and during the deposition steps, at least temporarily, a high-frequency power of 400 watts to 1500 watts is applied to the plasma source.

8. The method according to claim 6, wherein at least one of:

an increase in the high-frequency power during a change from the deposition steps to the etching steps is carried out one of stepwise and continuously; and a decrease in the high-frequency power during the change from the etching steps to the deposition steps is carried out one of stepwise and continuously.

9. The method according to claim 8, wherein at least the increase in the high-frequency power is carried out in such a manner that during this time, at least temporarily, an impedance of the high-frequency generator is adapted to a plasma impedance at least approximately in (a) one of a continuous and stepwise, and (b) an automated manner via a second arrangement.

10. The method according to claim 8, wherein at least one of:

a duration of the increase in the high-frequency power during the change from the deposition steps to the etching steps is 0.2 sec to 5 sec; and a duration of the decrease increase in the high-frequency power during the change from the etching steps to the deposition steps is 0 sec to 2 sec.

11. The method according to claim 7, wherein during the etching steps the high-frequency power is between 2000 watts and 4000 watts.

12. The method according to claim 7, wherein during the deposition steps the high-frequency power is between 500 watts to 1000 watts.

13. The method according to claim 9, wherein the second arrangement includes an impedance transformer.

14. The method according to claim 10, wherein the duration of the increase in the high-frequency power during the change from the deposition steps to the etching steps is 0.5 sec to 3 sec.

15. The method according to claim 10, wherein the duration of the decrease in the high-frequency power during the change from the etching steps to the deposition steps is 0 sec to 0.5 sec.

16. A device for etching a substrate with a plasma, comprising:

a plasma source adapted to generate a high-frequency electromagnetic alternating field;

a high-frequency generator adapted to apply a high-frequency power to the plasma source;

a reactor adapted to generate the plasma from reactive particles by the high-frequency electromagnetic alternating field acting on one of a reactive gas and a reactive gas mixture; and a first arrangement adapted to produce a periodical change in the high-frequency power applied to the plasma source, the first arrangement being a component for controlling a power of the high-frequency generator, the component including one of a digital ramp generator programmed via a software and an analog ramp generator.

* * * * *